United States Patent [19]

Danforth et al.

[11] Patent Number: 4,518,915
[45] Date of Patent: May 21, 1985

[54] TEST DEVICE FOR EXPENDABLE BATHYTHERMOGRAPH SET (XBT)

[75] Inventors: Philip G. Danforth, Old Mystic; Thomas G. Bucko, Colchester; Kenneth R. Galliher, Mystic, all of Conn.; Joseph T. Lucia, West Springfield, Mass.; Richard L. Miller, Niantic; Timothy B. Straw, New London, both of Conn.

[73] Assignee: The United States of America as represented by the Secretary of the Navy, Washington, D.C.

[21] Appl. No.: 463,103

[22] Filed: Feb. 2, 1983

[51] Int. Cl.³ .............................................. G01K 15/00
[52] U.S. Cl. .................................. 324/158 R; 374/134
[58] Field of Search ...................... 364/557, 578, 571; 324/158 R, 74; 340/870.04, 870.17; 374/1, 134, 136

[56] References Cited

U.S. PATENT DOCUMENTS

| | | | |
|---|---|---|---|
| 2,502,568 | 4/1950 | Hulsberg | 324/158 R |
| 3,479,645 | 11/1969 | Singleton | 340/870.04 |
| 4,218,916 | 8/1980 | Mutziger | 374/1 X |
| 4,293,916 | 10/1981 | Del Re et al. | 364/578 X |

*Primary Examiner*—Stewart J. Levy
*Assistant Examiner*—Stephen M. Baker
*Attorney, Agent, or Firm*—Robert F. Beers; Arthur A. McGill; Michael J. McGowan

[57] ABSTRACT

A stand-alone electronic simulator device for testing expendable bathythermograph (XBT) systems. The device is inserted into an XBT system in place of an expendable probe for purposes of checking the performance of the rest of the system with an active test signal. The test device simulates an operational XBT probe by switching a highly accurate and stable array of resistance values across its output. The switching rate is controlled by a stable internal time base such that the test pattern plotted on the strip chart recorder and transmitted to an external system will always look the same if the system is functioning properly. Temperature stability in the test device, essential because of the broad ambient temperature range which may be encountered in use, allows checks of the system for probe depth timing linearization in addition to temperature measurement.

5 Claims, 5 Drawing Figures

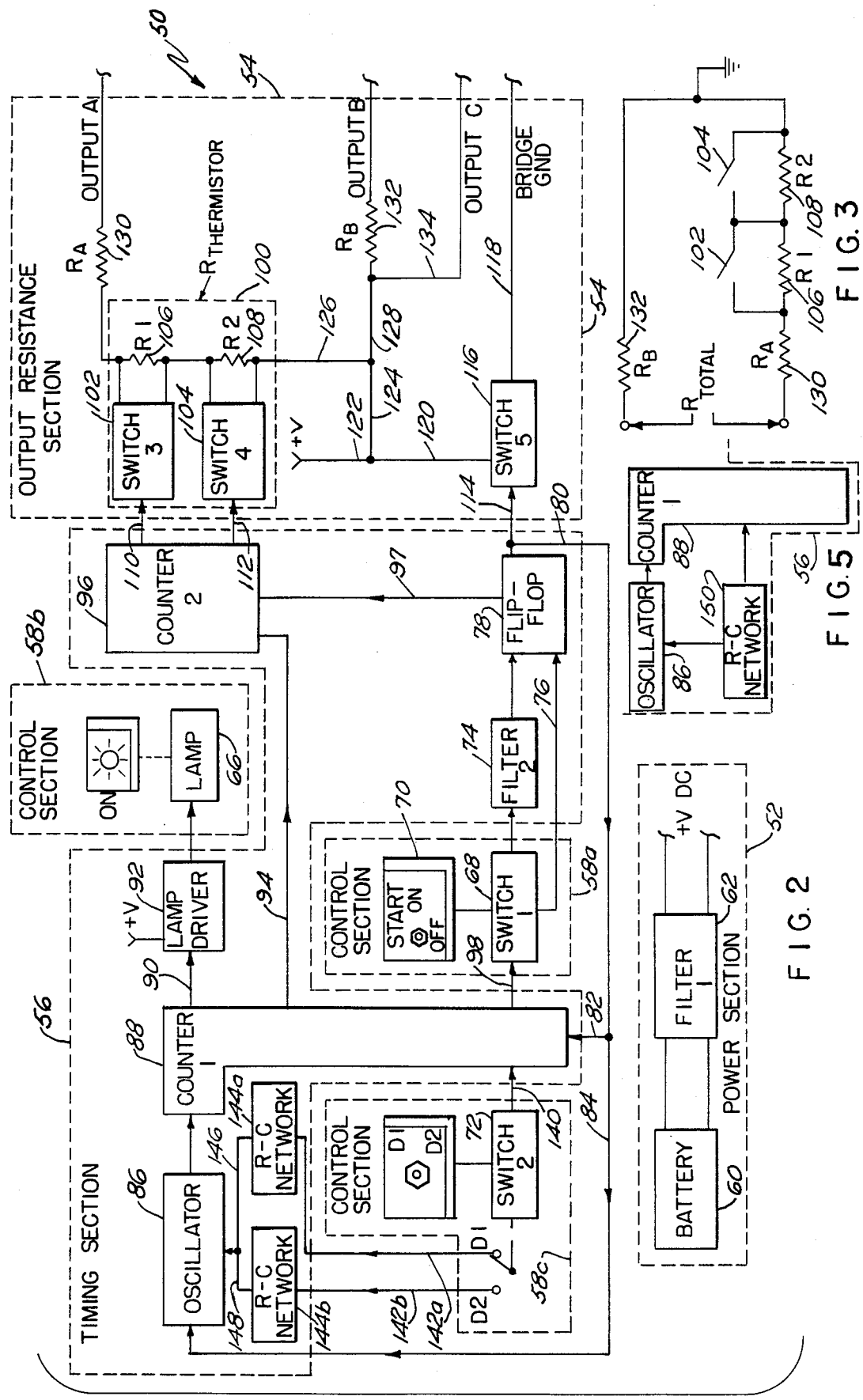

TEST DEVICE FOR EXPENDABLE BATHYTHERMOGRAPH SET (XBT)

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION (1) Field of the Invention

The present invention relates to system testing simulators and more particularly to a test device for simulating the output data generated by an expendable bathythermographic (XBT) probe. Such simulated data permits XBT system checkout and calibration over a broad temperature range.

(2) Description of the Prior Art

Present testing devices used with XBT systems have significant limitations. None of these devices are compatible with all of the current deployed XBT systems, i.e., AN/BSQ-23, AN/BQQ-6 and AN/SSQ series; nor are any of them packaged in a form that can be used with installed submarine XBT systems. In addition, none of these devices makes a timing check of the XBT system recorder's output of probe depth versus time for correct linearization. Some existing devices don't provide an active test signal characteristic of an operational XBT probe while other devices do not provide a test for the XBT probe's interface with the launcher unit, are inconvenient and cumbersome to use in that they require a considerable amount of time for hook-up to the XBT recorder, and in operation require an excessive amount of skill, training and time considering the level of testing being performed.

SUMMARY OF THE INVENTION

Accordingly, it is a general purpose and object of the present invention to provide a simulator for testing and calibrating a wide variety of XBT systems used onboard surface ships and submarines. It is a further object that the simulator output be stable over a broad range of ambient temperatures such as temperatures experienced by deck mounted surface ship XBT launchers. Another object is that the simulator automatically sequences through its test procedure and shuts off upon completion. A still further object is that the device have a self-contained source of power. Still another object is that the device inserts in the launcher in the same fashion as an XBT probe. These and other objects of the present invention will become apparent when considered in conjunction with the specification and drawings.

These objects are accomplished with the present invention by providing a stand-alone electronic simulator device for testing expendable bathythermograph (XBT) systems. The device is inserted into an XBT system in place of an expendable probe for purposes of checking the performance of the rest of the system with an active test signal. The test device simulates an active XBT probe by switching a highly accurate and stable array of resistance values across its output. The switching rate is controlled by a stable internal time base such that the test pattern plotted on the strip chart recorder and transmitted to an external system will always look the same if the system is functioning properly. Temperature stability in the test device, essential because of the broad ambient temperature range which may be encountered in use, allows checks of the system for probe depth timing linearization in addition to temperature measurement.

BRIEF DESCRIPTION OF THE DRAWINGS

A more complete understanding of the invention and many of the attendant advantages thereto will be readily appreciated as the same becomes better understood by reference to the following detailed description when considered in conjunction with the accompanying drawings wherein:

FIG. 2 shows a functional block diagram of an XBT system test device built according to the teachings of subject invention.

FIG. 3 shows the arrangement of the stable array of resistors which produce the simulated probe output signals.

FIG. 5 shows a strip chart recording such as is produced using the instant test device inserted into an XBT system.

DESCRIPTION OF THE PREFERRED EMBODIMENT

The XBT "Test Device" is a stand-alone electronic device for simulating the electrical behavior of an operational XBT probe to evaluate the performance of the other elements of an XBT system. XBT systems graphically record the ocean's vertical thermal profile using an expendable probe launched from a ship. During testing an active test signal is injected into the system's input in place of a real probe and recorded at the system's output on either a strip chart recorder, an external receiving system, or both. The system is operated in the same manner as for a real XBT probe measurement. The resulting test data can be quickly compared against a standard system chart to determine if component and/or interconnection problems exist. The test data will also help identify where in the system the problem lies to aid in fault isolation. The test device can be useful as a tool for periodic maintenance checkout of the XBT system because of its simple operation and brief test time of on the order of three minutes or less. No special test equipment is required as the test device is a self-powered, stand-alone device.

Figure 1:
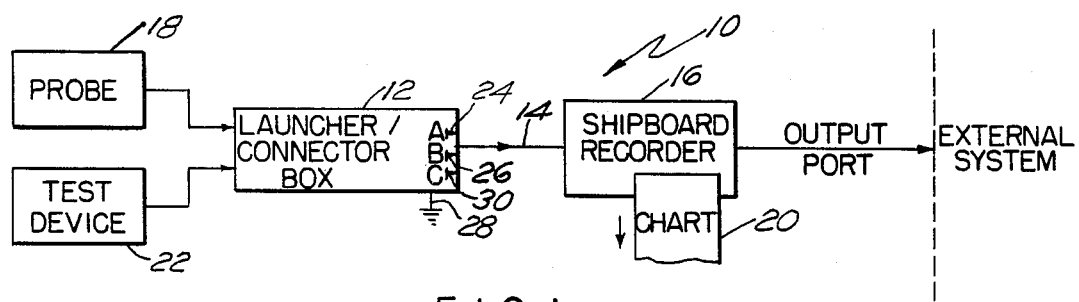
FIG. 1 shows a block diagram of a typical surface ship or submarine XBT system.

Referring now to FIG. 1 there is shown a block diagram of a typical XBT system 10 as deployed on either surface ships or submarines. System 10 comprises XBT launcher 12 connected via cable 14 to shipboard recorder 16. The output port of recorder 16 transmits system data to any preselected external system. During system 10 operation an XBT probe 18 is loaded into launcher 12 and is launched from the ship or submarine to measure sea water temperature profile starting at or near the ocean surface. When probe 18 contacts sea water, a ground return path is completed through the water to recorder 16, triggering recorder 16 into a measurement status. As probe 18 descends through the ocean, it continuously sends back temperature data to shipboard recorder 16 over a fine wire link. The probe senses temperature with a thermistor which varies its electrical resistance in response to temperature variations in the sea water. Recorder 16 measures the thermistor resistance, and plots on strip chart 20 ocean temperatures versus depth of probe. Probe depth is determined as a function of time knowing the probe descent rate. Data is also available for transmission to external systems from recorder 16's electrical output interface port. While a launcher is used on surface ships, a connector box is used on submarines to make electrical contact to probe 18 and pass the probe output signals on to recorder 16.

Test device 22 simulates active XBT probe 18 by switching a highly accurate and stable array of resistance values across its output. The switching rate is controlled by a stable internal time base such that the test pattern plotted on strip chart recorder 16 and transmitted to any external system will always look the same if the XBT system is functioning properly. Temperature stability in test device 22 is essential because of the broad ambient temperature range to which the device may be exposed, especially on the decks of the surface ships.

The test device circuitry may be housed in special configuration packages in order that the device be compatible with either surface ship or submarine XBT systems. The method of contact with either test device configuration is identical to that for the actual XBT probes being simulated, i.e., the connecting pin arrangement emulates standard XBT connecting pin identity. Pins 24 and 26 represent the "A" and "B" ports where thermistor resistance values are outputed. Pin 28 is the launcher housing ground. Pin 30, represented as port "C", initiates a recorder self-test routine. A surface ship test device configuration resembles an XBT probe canister which fits inside XBT system launcher 12. The test device will thus work with through-hull, stanchion, or hand-held type launchers. The XBT probe's sea water ground return contact, which triggers the recorder in measurement, is simulated in the test device by making a physical contact with the launcher housing at pin 28 which is grounded to the ship's hull. The submarine test device configuration is a small module which mounts to the side of the inboard connector box. The test device is equipped with a piece of the same signal cable used by submarine XBT probes which inserts into an orifice in the connector box. Ground return for the test device is made through a ground strap which attaches to a mounting bolt securing the connector box.

An important aspect of each test device is its simple operating procedure. The XBT system operates as if a real probe launching were taking place. Test device 22 is inserted into surface ship launcher 12 or connected to submarine connector box 12. Instead of jettisoning an XBT probe 18 from the ship, however, the operator switches on test device 16. The test device automatically sequences through its relatively short test cycle and shuts off at the completion of the test. The test cycle takes approximately the same amount of time as that of a real probe measurement. The chart trace 20 and the data received by the external system is then compared against reference standard data for references indicative of system malfunction.

Referring now to FIG. 2 there is shown a functional block diagram of an XBT simulator test device circuit 50. Test device circuit 50 comprises, in combination, a power section 52, an output resistance section 54, a timing section 56 and tripartite control section 58.

Circuit 50 is activated by D.C. power section 52 comprising a battery 60 such as a 9 volt alkaline or the like that provides at least 6 months of normal operating life for circuit 50. Low-power componentry is used throughout test device circuit 50 to minimize power consumption. Battery 60 can be easily replaced when drained. A first filter, 62, is connected across the output terminals of battery 60 to improve noise immunity. Battery connections to individual circuit components are not shown in every instance in order to simplify the diagram; however, such connections are well known in the art.

Control section 58 includes three functional sub-sections 58a, 58b and 58c. Control sub-section 58b has an indicator lamp 66 which flashes when test circuit 50 is operating. Lamp 66 thus shows the operator that the test device is running, and that the battery voltage level is satisfactory. Sub-section 58a controls the test cycle by means of 3-position switch 68 which is actuated by toggle 70. The START position of toggle 70 initiates cycle operation with a momentary pulse. After cycle initiation, switch 68 is released and returns to the ON position. To terminate a cycle already in progress, the OFF position is selected. Control sub-section 58c provides a cycle time select switch 72. The test device circuit shown has a selectable cycle time compatible with the typical operating time for either a 1500 foot depth XBT probe (D1) or a 2500 foot depth XBT probe (D2).

Timing section 56 provides timing signals to output resistance section 54, drives flashing indicator lamp 66 and shuts off power at the end of the test device operating cycle. Switch 68 in control sub-section 58a, when placed in the momentary START position, sets flip-flop 78 through filter 74 and parallel conductor 76. Output conductor 80 from flip-flop 78 divides into conductors 82 and 84. Conductor 84 connects directly to oscillator 86 which in turn connects to first counter 88. Conductor 82 connects directly to first counter 88 which produces three outputs. Counter 88 connects via output conductor 90 to lamp driver 92. Second output conductor 94 from first counter 88 connects to second counter 96. A second output conductor 97, from flip-flop 78 also connects to counter 96. A third output conductor 98 from first counter 88 connects to switch 68.

Oscillator 86 generates a stream of digital pulses to provide a stable output frequency to first counter 88. The oscillator pulse rate is controllable being determined by the values of the particular R-C network connected thereto. Oscillator 86 is selected to have a low drift rate; thus it is stable over a wide range of temperature, e.g., the oscillator may be an RCA type CD4047A or the like.

Of the three frequency outputs of counter 88, one output, 90, controls the flashing rate of indicator lamp 66 through lamp driver 92. Driver 92 receives low power pulses from counter 88 and provides high power pulses to operate lamp 66. Second frequency output 94 transmits pulses to counter 96 to control the amount of time a resistance output value is switched across the test device's output terminals. Counter 96 divides the total operating cycle, and hence the output pulse stream from counter 88, into either 6 or 12 equalized time intervals during which one of four different resistance values is switched across the test device output terminals. The third frequency output 98 is a turnoff signal to switch 68 at the end of the device operating cycle.

Filter 74, provides a noise immune voltage to set the initial high value of flip-flop 78 when switch 68 is in its normal "ON" position. The START or OFF switch positions ground the input of flip-flop 78 thereby changing the flip-flop output which resets oscillator 86 and counter 88. Flip-flop 78 thus acts as an ON-OFF memory which is set by the START signal from switch 68 through filter 74.

Output resistance section 54 provides the stable array of resistance outputs which simulate an XBT probe thermistor's resistance outputs. Output A and output B of section 54 form two legs of the XBT system recorder resistance measurement bridge. Thermistor 100, in order to simulate the XBT probe's resistance outputs, comprises switches 102 and 104 which connect in parallel across resistors 106 (R1) and 108 (R2) respectively. Switches 102 and 104 are controlled by counter 96, located in timing section 56, through conductors 110 and 112 respectively. An additional conductor 114 from flip-flop 78 connects to switch 116, also within output resistance section 54. Switch 116 provides a bridge ground connection via conductor 118 for balancing the bridge circuit and signaling the recorder to begin its measurement. The ground return simulates action of the XBT probe when it contacts sea water after launch. Switch 116 connects bridge ground to the output resistance network in the test device, when the test device control switch is set to the START position. Switch 116 is powered by battery 60, connecting through serial conductors 120 and 122. Conductor 122 also connects by way of conductor 124 to conductors 126 and 128. Conductor 126 provides power across the series resistor arrangement of thermistor simulator 100 and also resistor 130 ($R_A$). The output of $R_A$ is referred to as output A. Conductor 128 provides power across resistor 132 ($R_B$), the output of which is referred to as output B. $R_A$ is approximately equal to $R_B$. Conductor 134, attaching to conductor 128 just prior to resistor 132, provides output C. Switches 102, 104 and 116 must be of low resistance relative to $R_A$, $R_B$ and $R_{TH}$ so as to not greatly effect these resistors characteristic values. Field effect transistors (FET's) may be used for the three switches due to their low closed resistance, high open resistance and good temperature stability. Resistors $R_A$, $R_B$, R1 and R2 must have low temperature coefficients for stable operation, such as a Vishay Type S102 or the like.

Control section 58c provides the appropriate rate of oscillator 86 output for simulating multiple XBT probe depth outputs. Switch 72 connects via conductor 140 to counter 88. Additionally, switch 72 connects via conductors 142a and 142b, R-C networks 144a and 144b and conductors 146 and 148 to oscillator 86. Selecting D1 or D2 switches different R-C networks 144a and 144b across oscillator 86. Each R-C network has been preselected to emulate the time duration of a particular XBT probe. In conjunction with counter 96, this time cycle is divided into six intervals to simulate the approximate full depth of the probe on the trace, e.g., 1500 feet. For a 2500 foot probe, the six interval cycle of counter 96 is repeated which doubles the counter 88 pulse stream length. Output C controls the start of record self-check.

Referring now to FIG. 3 there is shown schematically the arrangement of resistances which simulate an XBT probe's output signals, here identified as $R_{TOTAL}$ and defined as $R_A + R1 + R2 - R_B$. By varying the open and closed positions of switches 102 and 104 as determined by timed control signals from counter 96, four different $R_{TOTAL}$ outputs may be generated. Each $R_{TOTAL}$ value simulates an $R_{TH}$ value for an XBT probe temperature measurement. Resistors $R_A$ and $R_B$ simulate the resistance values of the XBT probe's "A" and "B" output wires.

Figure 4:
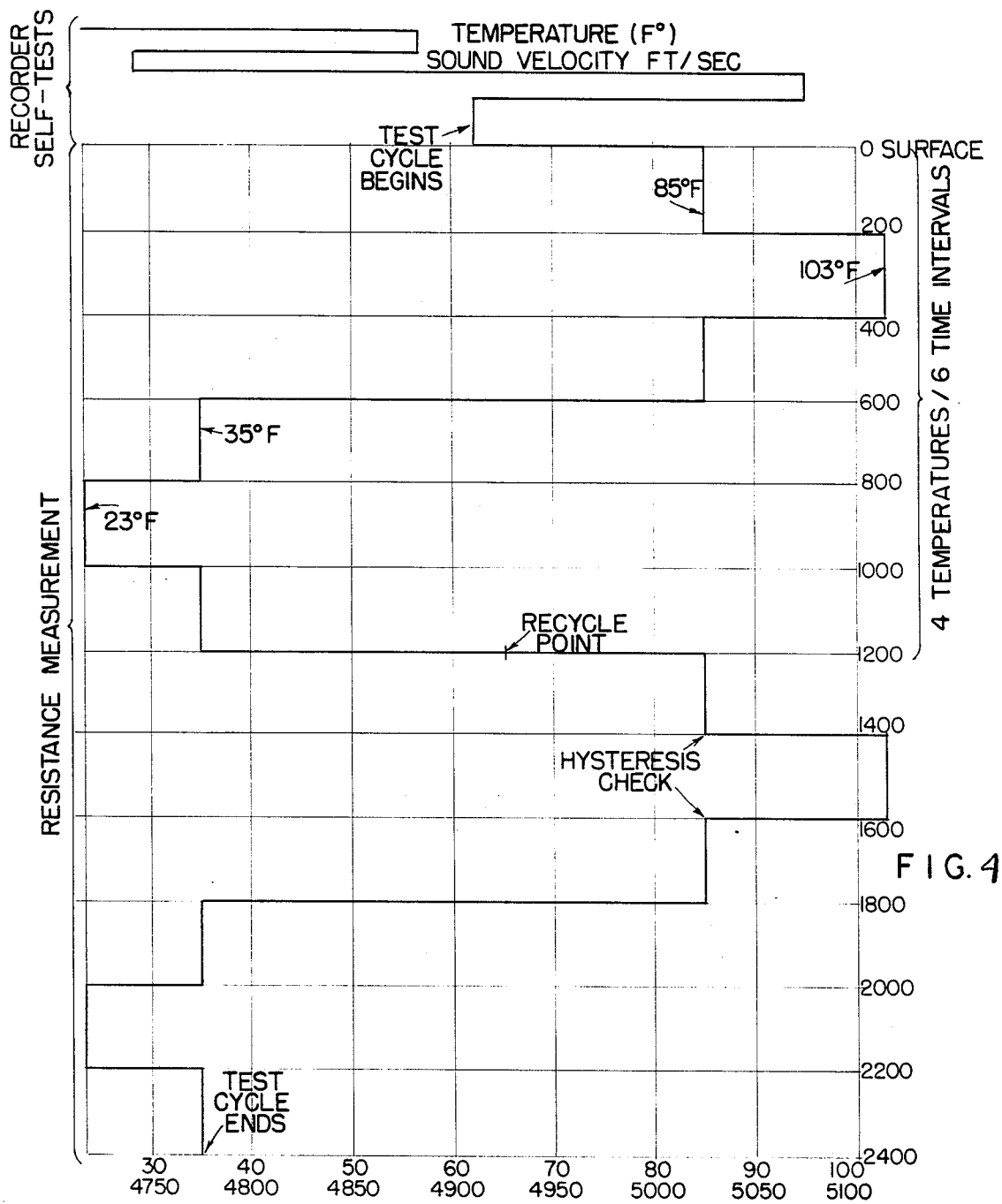
FIG. 4 shows an alternate fixed timing version of subject test device R-C network.

FIG. 4 shows a one depiction strip chart recording for an XBT test device. Features of the plotted pattern are described below. The key feature of the test device is its ability to provide test data which will identify if a problem exists in the launcher/connector box, strip chart recorder, or data interface to the external system. Temperature values and depth axis timing are modified within the XBT test device circuit design by varying appropriate resistors and R-C network values.

The recorder performs built-in self-tests of its internal calibration and plots the results on the strip chart in the area above the surface depth line. A continuity measurement through the connector box and the test device circuit as a gross check for an open or short circuit condition is also made.

The test device is turned on to begin the test cycle, and the recorder begins its measurements starting at the surface depth line. When the test device is turned on, it also closes a connection to complete a ground return path back to the recorder. Failure to trigger the recorder into measurement at this point would be an indication of a poor ground termination in the connector box or launcher.

The recorder measures the resistance output of the test device. For the example plotted in FIG. 5, the test device transmits resistance values which equate to 85° F., 35° F., offscale high range and offscale low range. The offscale high range value is plotted at 103° F. and the offscale low range value is plotted at 23° F. The offscale high and low values are used for purposes of alerting the external system that the data being sent is test data and not real ocean temperature data. The measurements at 35° F., and 85° F. will identify whether a problem exists in the connector box or launcher connector cabling if the plotted values are offset from their correct readings. The 35° F. and 85° F. measurements can also be used to calibrate the recorder unit if the recorder's internal calibration checks at the top of the figure indicate the recorder is out of adjustment.

The data transmitted to the external system can be crosschecked against the data plotted on the chart recorder to determine if the external system interface is functioning properly.

The chart recorder's servo, which positions the pen stylus across the temperature axis, may be checked for gain, damping, slew rate, and hysteresis. Gain and damping problems would appear as stylus overshoot or undershoot after a step change in temperature. Slew rate, or the rate at which the stylus moves across the chart, can be measured for pen travel in both the upscale and downscale directions. Hysteresis is the offset error resulting from the pen moving to the same temperature value from two directions, upscale and downscale.

The advantages of the XBT test device over previous XBT system test devices are as follows: the XBT test device performs an efficient and complete system check of the launcher/connector box, the recorder and the external system interface using an active test signal in simulation of an operation XBT probe. It operates with all XBT systems, both surface ship and submarine. The test device takes the place of the XBT probe and is packageable for implementation with both surface ship and submarine XBT systems. It checks the system for probe depth timing linearization in addition to temperature measurement. The output trace isolates malfunctions as an aid to troubleshooting. The device is simple to operate, requiring little training and no change to normal XBT system operating procedures. It is completely self-contained, no additional test equipment is required. Such device provides accurate and stable test signals over a broad temperature range using precision, low drift, low power electronic components. In addition it provides offscale test signals to alert external receivers that a test is in progress. It also requires a minimal amount of test time.

Performance specifications for a typical XBT test device are listed in the following table.

Table 1

| XBT Test Device Specifications | |
|---|---|
| Parameter | Specification |
| Cycle Timing Accuracy | ±0.15% max (12.5° to 37.5°C) |
| | ±.03% max (0° to 50°C) |
| Resistance Output Accuracy | ±0.1% max (0° to 50°C) |
| Resistance Settling Time | 1 msec |
| Isolation Resistance | |
| Resistance Output to GND | 50 MΩ, min. |
| Power Requirements | |
| Battery Type | Std. 9 v. alkaline, replaceable |
| Voltage, Rated Performace | 6–10 vdc |
| Current, Operating | 5 ma, typ |
| Current, Quiescent | 2µa, max |
| Temperature Range | |
| Operating Rated Performance | 0° to 50°C |
| Storage (less battery) | −62° to +71°C |
| Indicator Lamp | Flashes when cycle running |
| Package | Moistureproof |
| Surface Ship systems | Inserts into Launcher |
| | Grounded thru Launcher housing |
| Submarine systems | Mounts to side to Connector Box |
| | Grounded thru Connector Box mounting bolt |
| | Output signal thru piece of submarine probe tether wire cable |

What has thus been described is a simulator device to be inserted into a surface ship launcher or connected to a submarine connector box in lieu of an XBT probe. The test device includes a plurality of temperature stable resistors selectable in an accurately timed fashion by temperature stable electronic timer circuitry in order to test the linearity of the XBT system recorder and also the interconnections of the launcher, recorder and any external device connected to the recorder.

Obviously many modifications and variations of the present invention may become apparent in light of the above teachings. For example, as shown in FIG. 4, a fixed, single value R-C network 150 may be used to connect oscillator 86 and counter 88. This obviates the need for switch 72 in subsection 58c but provides only a single fixed depth simulation. If a greater number of selectable depths are desired, control subsection 58c may be expanded to a corresponding switch having the requisite number of positions connected in parallel to a corresponding number of R-C networks. Battery voltage and size may also be varied without deviating from the teachings of this invention. Resistor values may be varied to produce other desired temperature indications.

In light of the above, it is therefore understood that within the scope of the appended claims, the invention may be practiced otherwise than as specifically described.

What is claimed is:

1. A device for testing an XBT system, comprising:
   a D.C. power source;
   a first control means, connected to said D.C. power source, for applying said D.C. power to said test device in such a way as to initiate a test cycle, said first control means further comprising a three position switch, the START position of which is capable of providing a momentary pulse;
   timing means, attached to said first control means, for receiving said momentary pulse from said first control means and producing a preselected number of pulses over a preset time interval for controlling said test cycle, said timing means further comprising, a flip-flop, connected to said first control means, for receiving said momentary pulse and setting in such a way as to produce an appropriate output signal, said flip-flop remaining in said test state after said switch returns to its normal ON position, an oscillator, connected to said flip-flop, for receiving said flip-flop output signal and producing an output stream of pulses therefrom, a first counter, connected to said oscillator and to said three position switch for receiving said output pulse stream from said oscillator to count the number thereof, and the output of said flip-flop, a second counter, connected to said first counter and said flip-flop, for receiving the outputs therefrom and dividing the output pulse stream from said first counter into six equal intervals, and a plurality of R-C networks, connected to said second control means and to said oscillator, for controlling the output pulse rate of said oscillator;
   a second control means, attached to said timing means, for providing a preselected test cycle time duration;
   a third control means, attached to said timing means, for indicating test device power-on and test-in-progress; and
   thermistor simulating means, attached to said timing means, for receiving sequenced timing signals from said timing means and switching a preset sequence of resistance values across the output of said thermistor simulating means in such a way as to simulate a plurality of temperature-proportional resistance measurements produced by an actual XBT probe.

2. A test device according to claim 1 wherein said second control means is a multi-pole switch, connected to said first counter and to said plurality of R-C networks in such a way that only one R-C network is connected to said oscillator at any time.

3. A test device according to claim 2 wherein said third control means is an indicator light connected to one output of said first counter for displaying a flashing indication that said test device is in operation.

4. A test device according to claim 3 wherein said thermistor simulating means further comprises:
   a thermistor simulator, attached to said second counter in such a way that said second counter controls the resistance value thereof;
   a first temperature stable resistor $R_A$ connected to one side of said thermistor simulator;
   a second temperature stable resistor $R_B$ connected to the other side of said thermistor simulator; and
   a low resistance, temperature stable ground switch for providing a ground to a recorder bridge circuit, said ground switch also being connected to said flip-flop.

5. A test device according to claim 4 wherein said thermistor simulator further comprises:
- a third temperature stable resistor $R_1$ connected in series with said resistors $R_A$ and $R_B$;
- a fourth temperature stable resistor $R_2$ connected in series with said resistors $R_1$ and $R_B$;
- a first low resistance, temperature stable switch, connected in parallel across said third resistor $R_1$; and
- a second low resistance, temperature stable switch, connected in parallel across said fourth resistor $R_2$.

* * * * *